(12) United States Patent
Jun et al.

(10) Patent No.: US 9,337,121 B2
(45) Date of Patent: May 10, 2016

(54) SEMICONDUCTOR DEVICE AND METHOD OF FABRICATING THE SAME

(71) Applicant: Electronics and Telecommunications Research Institute, Daejeon (KR)

(72) Inventors: Chi Hoon Jun, Daejeon (KR); Sang Choon Ko, Daejeon (KR); Seok-Hwan Moon, Daejeon (KR); Woojin Chang, Daejeon (KR); Sung-Bum Bae, Daejeon (KR); Young Rak Park, Daejeon (KR); Je Ho Na, Seoul (KR); Jae Kyoung Mun, Daejeon (KR); Eun Soo Nam, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/324,724

(22) Filed: Jul. 7, 2014

(65) Prior Publication Data

US 2015/0194363 A1    Jul. 9, 2015

(30) Foreign Application Priority Data

Jan. 9, 2014 (KR) .................. 10-2014-0002913

(51) Int. Cl.
*H01L 23/367* (2006.01)
*H01L 21/308* (2006.01)
*H01L 23/473* (2006.01)
*H01L 23/467* (2006.01)
(Continued)

(52) U.S. Cl.
CPC .......... *H01L 23/367* (2013.01); *H01L 21/3065* (2013.01); *H01L 21/3081* (2013.01); *H01L 21/32051* (2013.01); *H01L 23/467* (2013.01); *H01L 23/473* (2013.01); *H01L 2924/0002* (2013.01)

(58) Field of Classification Search
CPC . H01L 23/367; H01L 21/3081; H01L 23/473; H01L 23/467; H01L 21/3065; H01L 21/32051; H01L 2924/0002
See application file for complete search history.

(56) References Cited

U.S. PATENT DOCUMENTS

| 6,101,715 A * | 8/2000 | Fuesser et al. ............. 29/890.03 |
| 6,582,987 B2 | 6/2003 | Jun et al. |
| 2004/0190253 A1* | 9/2004 | Prasher ............... F28D 15/0233 D15/233 |

(Continued)

OTHER PUBLICATIONS

P.C. Chao et al., "A New High Power GaN-on-Diamond HEMT with Low-Temperature Bonded Substrate Technology", CS MANTECH Conference, pp. 179-182, May 2013.

(Continued)

*Primary Examiner* — Yasser A Abdelaziez
*Assistant Examiner* — Farun Lu
(74) *Attorney, Agent, or Firm* — Rabin & Berdo, P.C.

(57) ABSTRACT

Provided are a semiconductor device and a method of fabricating the same. The semiconductor device includes: an active region provided on a substrate; an inlet channel formed as a single cavity buried in one side of the substrate; an outlet channel formed as a single cavity buried in the other side of the substrate; a micro channel array comprising a plurality of micro channels, wherein the plurality of micro channels are formed as a plurality of cavities buried in the substrate, and one end of the micro channel array is connected to a side of the inlet channel and the other end of the micro channel array is connected to a side of the outlet channel; and a micro heat sink array separating the micro channels from one another.

14 Claims, 8 Drawing Sheets

(51) Int. Cl.
  *H01L 21/3065* (2006.01)
  *H01L 21/3205* (2006.01)

(56) References Cited

U.S. PATENT DOCUMENTS

2006/0113063 A1  6/2006  Chordia et al.
2007/0215325 A1  9/2007  Solovitz et al.
2009/0283902 A1* 11/2009 Bezama ............. H01L 23/3675
                                                            257/713

OTHER PUBLICATIONS

Yong Jiun Lee et al., "GaN-on-Si Hotspot Thermal Management Using Direct-die-attached Microchannel Heat Sink", IEEE 14th Electronics Packaging Technology Conference, pp. 577-581, Dec. 2012.

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2014-0002913, filed on Jan. 9, 2014, the entire contents of which are hereby incorporated by reference.

BACKGROUND OF THE INVENTION

The present invention disclosed herein relates to a semiconductor device and a method of fabricating the same, and more particularly, to a semiconductor device having a cooling structure and a method of fabricating the same.

As the capacity of home appliances and industrial systems increases and an electric vehicle (EV) and a hybrid/plug-in hybrid electric vehicle (HEV/PHEV) emerge, the usage of electrical energy sharply increases and a need for efficiently managing a electrical grid using a smart grid increases. Thus, high power semiconductor devices as core components that affect the efficient energy usage, stability, and reliability of electronic equipments become important recently. Also, as RF components and related systems in wireless communication and military service need broad band frequency and high output power, the power density of RF semiconductor devices also sharply increases.

These semiconductors are electronic devices used for converting or controlling electrical power or outputting a high-frequency RF signal and have a characteristic that they operate at a high voltage, a high current, a high frequency, and high output power. For example, the semiconductor devices may be transistors such as a metal oxide semiconductor field effect transistor (MOSFET), a metal semiconductor field effect transistor (MESFET), a high electron mobility transistor (HEMT), a junction field effect transistor (JFET), an insulated gate bipolar transistor (IGBT), and a bipolar junction transistor (BJT), a schottky or PiN diode, and a thyristor. When the semiconductor devices are applied to modules, components and systems, the thermal management of the devices is a core issue that affects the entire reliability. That is, when the thermal management is not properly performed, the semiconductor device is locally heated in operation and a device characteristic thus decreases or internal interconnections are degraded due to the electromigration of atoms forming interconnections. As a result, there is a limitation in that the semiconductor device wrongly operates or is damaged. It is being reported that the fact also appears in a CPU, an ASIC, a micro sensor, a micro actuator, a micro electromechanical system (MEMS), a high electrical power or high output power transistor and diode, accompanying occurrence of a high temperature during operation. The cooling of a device comes to the fore also in a high output power laser diode (LD) and light-emitting diode (LED).

Typical cooling methods of electronic devices include attaching a thick metal base plate and combining a heat sink emitting heat and then performing natural cooling or circulating a coolant with a fan or a pump.

Recently, the device cooling is also performed by further fabricating heat spreaders or a plurality of thermal vias on one or both sides of the semiconductor device. Also, there is an attempt to lower a device temperature by decreasing a thermal resistance using silicon carbide (SiC) or diamond, which is especially excellent in thermal conductivity, as a substrate.

Typical cooling methods have a complex form in which an external cooling device is assembled to the semiconductor device, and has a high thermal resistance because a volume and a thickness are especially large. Also, there is a limitation in that peripheral parts used for cooling are more expensive compared to the semiconductor device. In addition, there is a limitation in that there are needs for a complex semiconductor fabricating process or an expensive semiconductor substrate.

SUMMARY OF THE INVENTION

The present invention provides a structure that may be integrated directly into a semiconductor device, and a semiconductor device that efficiently emits heat to easily cool a device and may be implemented by a semiconductor process.

Embodiments of the present invention provide semiconductor devices including: an active region provided on a substrate; an inlet channel formed as a single cavity buried in one side of the substrate; an outlet channel formed as a single cavity buried in the other side of the substrate; a micro channel array comprising a plurality of micro channels, wherein the plurality of micro channels are formed as a plurality of cavities buried in the substrate, and one end of the micro channel array is connected to a side of the inlet channel and the other end of the micro channel array is connected to a side of the outlet channel; and a micro heat sink array separating the micro channels.

In some embodiments, the substrate may include: a first surface on which the active region is arranged; and a second surface being the opposite surface of the first surface, wherein the inlet channel, the outlet channel, the micro channel array, and the micro heat sink array may be arranged on the second surface of the substrate.

In other embodiments, an entry point on one end of the inlet channel and an exit point on one end of the outlet channel may be formed on sides of the substrate that face each other.

In still other embodiments, an entry point on one end of the inlet channel and an exit point on one end of the outlet channel may be formed on the same side of the substrate.

In even other embodiments, a cooling medium flowing through the inlet channel, the micro channel array and the outlet channel may include at least one of liquid, gas, a mixture of liquid and gas, and supercritical fluid.

In yet other embodiments, the micro heat sink array may include the substrate and a conductive layer.

In further embodiments, the single cavity forming the inlet channel, the single cavity forming the outlet channel, and the plurality of cavities forming the micro channel array may be connected to one another.

In still further embodiments, the substrate may include: a first surface on which the active region is arranged; and a second surface being the opposite surface of the first surface, wherein the conductive layer may include: a first conductive layer provided on the second surface of the substrate; and a second conductive layer provided on the first conductive layer, wherein the second conductive layer may seal the single cavity forming inlet channel, the single cavity forming the outlet channel, and the plurality of cavities forming the micro channel array.

In even further embodiments, the micro heat sink array may include a plurality of plates, wherein the plurality of plates may be distributed on the second surface of the substrate, extended in a first direction and spaced apart from one another in a second direction that crosses the first direction.

In yet further embodiments, the micro heat sink array may include a plurality of plates, wherein the plurality of plates may be distributed on the second surface of the substrate and spaced apart from one another in a first direction and in a second direction that crosses the first direction.

In much further embodiments, the micro heat sink array may include a plurality of cylinders, wherein the plurality of cylinders may be distributed on the second surface of the substrate.

In still much further embodiments, the micro heat sink array may include a plurality of rectangular parallelepipeds, wherein the plurality of rectangular parallelepipeds may be distributed on the second surface of the substrate.

In even much further embodiments, the conductive layer may include at least one of an inorganic material, an organic material, and a mixed material of the inorganic material and the organic material.

In yet much further embodiments, the conductive layer may be formed in a singe layer or in multiple layers.

In other embodiments of the present invention, methods of fabricating a semiconductor device include providing a substrate; forming an active region of a bottom of the substrate; forming a first conductive layer on a top of the substrate; patterning the substrate by etching using the first conductive layer as an etching mask to form a plurality of open cavities in the substrate; and forming a second conductive layer on the first conductive layer to seal the plurality of open cavities.

In some embodiments, the forming of the plurality of open cavities in the substrate may include: anisotropically etching the substrate perpendicularly from the top of the substrate toward the bottom of the substrate by etching using the first conductive layer as an etching mask to form a plurality of trenches; and further isotropically etching the plurality of trenches to form the plurality of open cavities.

In other embodiments, the anisotropic etching of the plurality of trenches may use reactive ion etching (RIE) or deep RIE.

In still other embodiments, the isotropic etching of the plurality of trenches may use plasma etching or gas phase etching.

In even other embodiments, the forming of the first and the second conductive layers may use e-beam evaporation or sputtering.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

A semiconductor device according to the present invention will be described below in detail with reference to the accompanying drawings.

Advantages of the present invention over related art will become clear through the detailed description and the following claims along with the accompanying drawings. In particular, the present invention is well defined and clearly claimed in the claims. However, the present invention may be best understood by referring to the following detailed description in connection with the accompanying drawings. The same reference signs represent the same components in different drawings.

A semiconductor device according to embodiments of the present invention is described below in detail with reference to the accompanying drawings.

Figure 1:
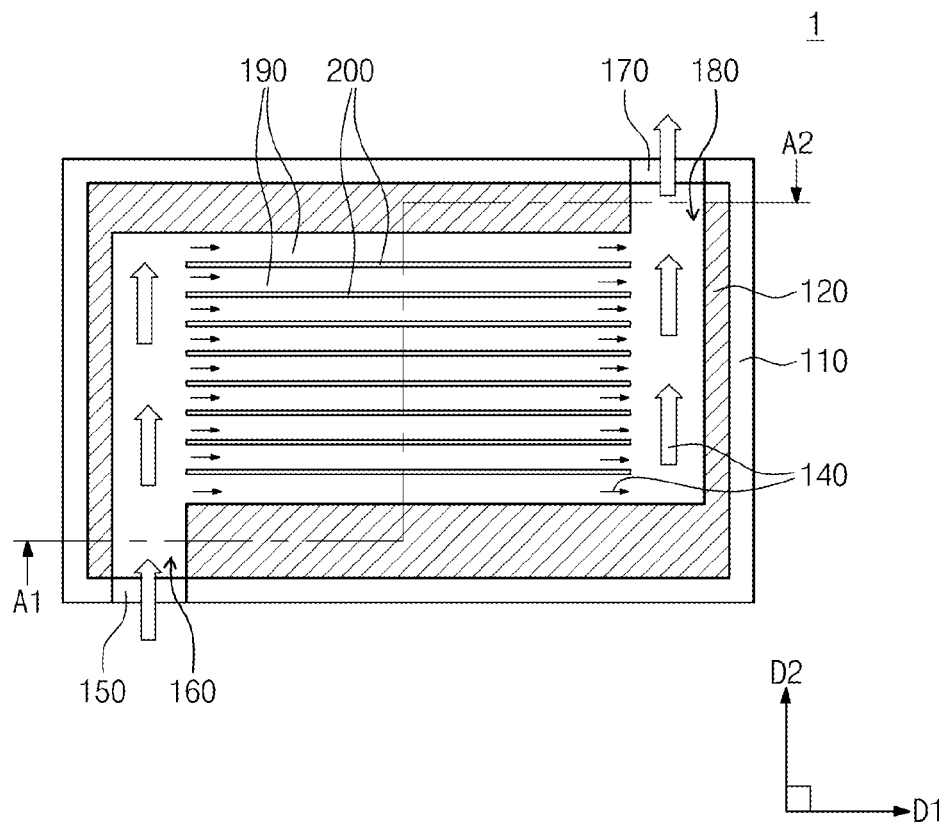
FIG. 1 is a plane view of a semiconductor device according to an embodiment of the present invention.
Figure 2:
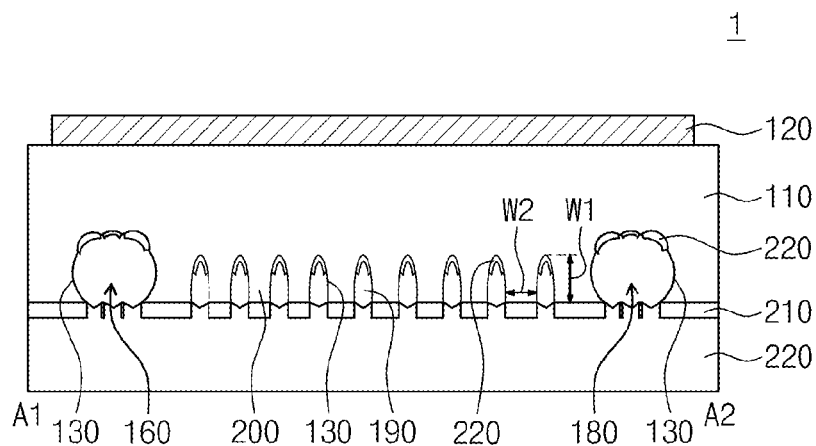
FIG. 2 is a cross-sectional view taken along broken line A1-A2 of FIG. 1.

FIG. 1 is a plane view of a semiconductor device according to a first embodiment of the present invention. FIG. 2 is a cross-sectional view taken along broken line A1-A2 of FIG. 1.

Referring to FIGS. 1 to 2, a semiconductor device 1 according to an embodiment of the present invention may include a substrate 110, an active region 120, an inlet channel 160, an outlet channel 180, a micro channel array 190, and a micro heat sink array 200.

The substrate 110 may include a cooling micro structure for cooling a semiconductor device 1. The substrate 110 may include silicon or other materials without limitation to the above-described material.

The active region 120 may be formed on the substrate 110 and function as an electronic device. The active region 120 may function as any one of a transistor, a diode, a CPU, an application specific integrated circuit (ASIC), a micro sensor, a micro actuator, and a micro electromechanical system (MEMS).

The inlet channel 160, the outlet channel 180, the micro channel array 190, and the micro heat sink array 200 may be buried in the substrate 110. The inlet channel 160, the outlet channel 180, the micro channel array 190, and the micro heat sink array 200 may be formed on the opposite side of the substrate that faces a side of the substrate 110 adjoining the active region 120.

The inlet channel 160 is formed as a cavity buried in the substrate 110 and an entry point 150 through a cooling medium 140 flows into the substrate may be formed on one end of the inlet channel. The inlet channel 160 may be connected to one end of the micro channel array 190. The inlet channel 160 may enable the cooling medium 140 to uniformly flow from the outside of the substrate 110 to the micro channel array 190 in the substrate 110.

The outlet channel 180 is formed as a cavity buried in the substrate 110 and an exit point 170 that discharges the cooling medium 140 to the outside of the substrate 110 may be on one end of the outlet channel. The outlet channel 180 may be connected to the other end of the micro channel array 190. The outlet channel 180 may enable the cooling medium 140 to uniformly flow from the micro channel array 190 in the substrate 110 to the outside of the substrate 110. The entry point 150 and the exit point 170 may be provided on sides facing each other (e.g., upper and lower sides or left and right sides) of the substrate 110.

The cooling medium 140 is a medium cooling the semiconductor device 1 and may use a single phase material such as liquid or gas, a two-phase material formed by mixing gas and liquid, or supercritical fluid.

The micro channel array 190 may be formed as a plurality of cavities buried in the substrate 110. One end of the micro channel array 190 is connected to the inlet channel 160 and the other end is connected to the outlet channel 180 so that the cooling medium 140 may uniform flow in the substrate 110. The micro channel array 190 may be a form in which a plurality of micro channels are connected to the inlet and outlet channels 160 and 180 for uniform flow of the cooling medium 140. How the cooling medium 140 flows may depend on the form of the micro heat sink array 200 that forms a plurality of barriers and separates micro channels from one another.

The cavity forming the inlet channel 160, the cavity forming the outlet channel 180, and the plurality of cavities forming the micro channel array 190 may be connected to one another. The cavities may have a height of about 20 μm to 200 μm.

As the aspect ratio W1/W2 of the micro heat sink array 200 increases, the surface region of the micro heat sink array 200 may increase. The large surface region of the micro heat sink array 200 may easily induce transfer of heat generated from the active region 120 to the micro channel region. The micro heat sink array 200 may include the substrate 110, a first conductive layer 210, and a second conductive layer 220. In order to efficiently dissipate heat generated from the active region 120 and lower a thermal resistance against heat transfer, the distance between the active region 120 and the micro heat sink array 200 may be short.

The micro heat sink array 200 may function as a plurality of barriers that divides the micro channel array 190 into a plurality of micro channels in the substrate 110. Cooling efficiency by the flow of the cooing medium 140 may be maximized by the micro heat sink array 200. The micro heat sink array 200 may function as a supporting part that supports micro structures formed in the substrate 110. The micro heat sink array 200 may uniformly dissipate heat generated from the active region 120. The micro heat sink array 200 may have the shape of plates that are arranged at a certain interval in a second direction D2 and extended in a first direction D1. The cooling medium 140 may flow into the substrate 110 through the inlet channel 160 and may uniformly flow through the micro channel array 190. The heat generated from the active region 120 by the micro heat sink array 200 forming a plurality of barriers may be heat-transferred by a flow of the cooling medium and may be discharged to the outside of the semiconductor device 1 through the outlet channel 180.

The first and the second conductive layers 210 and 220 may be formed of an electrically conductive material so that the entire substrate 110 may function as a ground or electrode for the active region 120 when packaging the semiconductor device 1. The first and the second conductive layers 210 and 220 may be formed of a material which has good thermal conductivity. The first and the second conductive layers 210 and 220 are formed in a single layer or in multiple layers and may include a metal such as Ti, Cr, Pt, Ni, Ag, Al, Ta, Mo, W, Cu, or Au, an inter-metallic compound or a metal compound such as TiW, TiN, TaN, WN, or NiV, or a nano material such as carbon nano tube (CNT) or graphene. The first conductive layer 210 may have a thickness of about 0.5 μm to 3 μm and the second conductive layer 220 may have a thickness of about 20 μm to 200 μm.

FIGS. 3 to 6 are plane views of semiconductor devices according to other embodiments of the present invention; Differences between the above-described embodiment and other embodiments are mainly described below.

Figure 3:
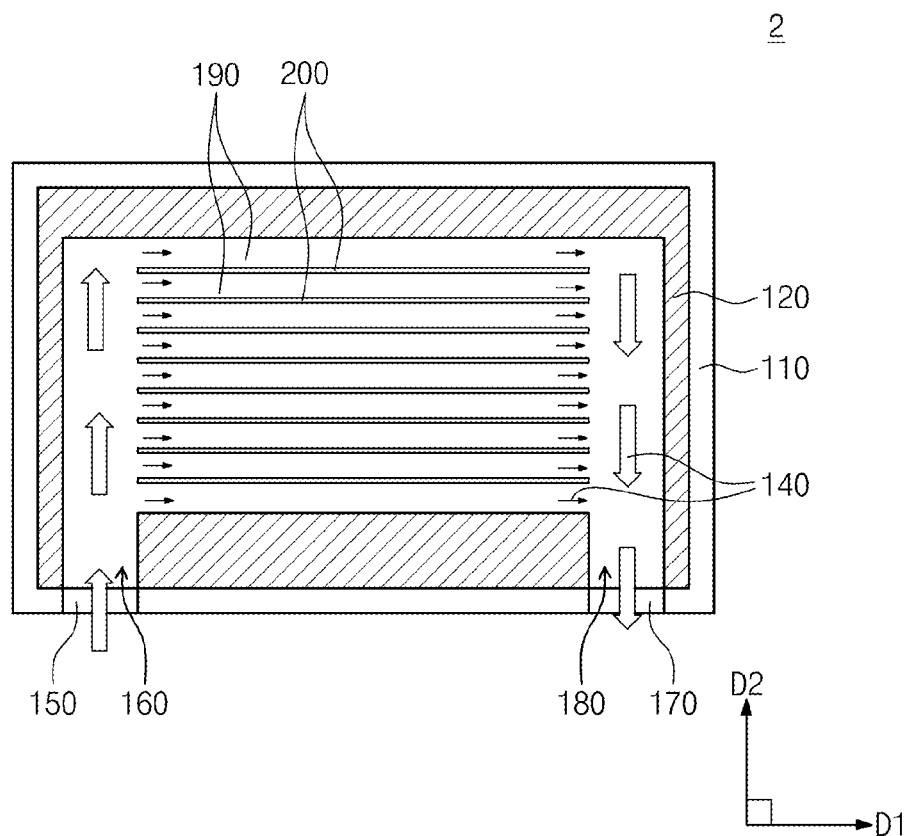
FIG. 3 is a plane view of a semiconductor device according to another embodiment of the present invention.

Referring to FIG. 3, a semiconductor device 2 according to another embodiment of the present invention may have the entry point 150 and the exit point 170 on the same side of the substrate 110. The micro heat sink array 200 may have the shape of plates that are arranged at a certain interval in a second direction D2 and extended in a first direction D1.

Figure 4:
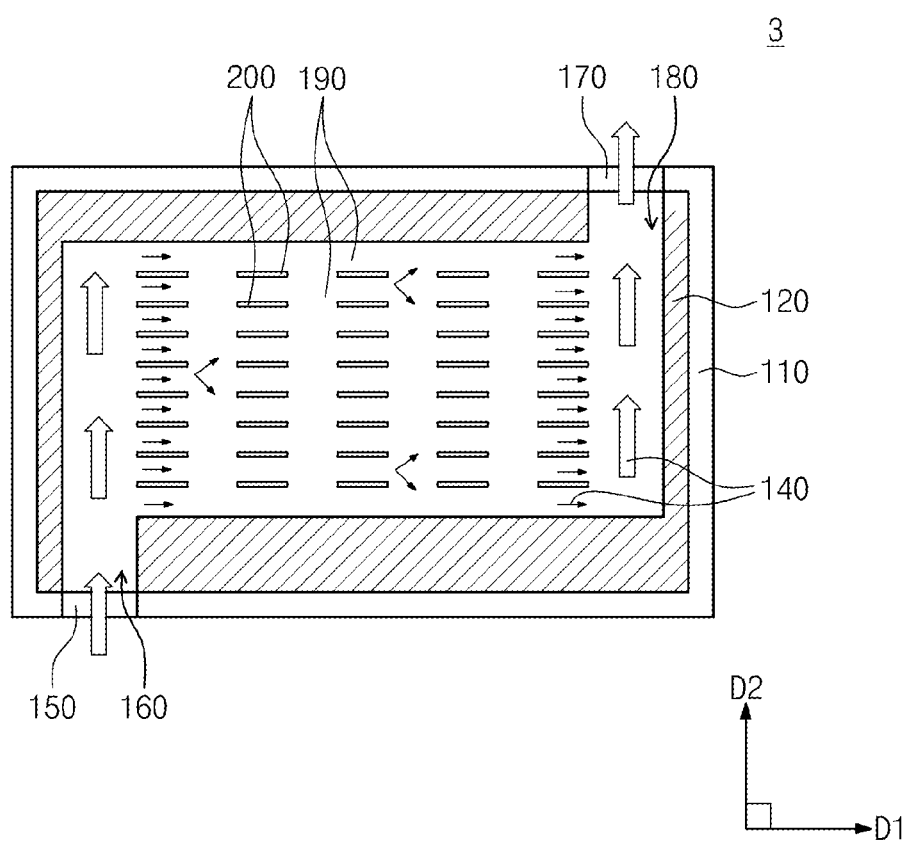
FIG. 4 is a plane view of a semiconductor device according to another embodiment of the present invention.

Referring to FIG. 4, a semiconductor device 3 according to another embodiment of the present invention may have the entry point 150 and the exit point 170 on sides of the substrate 110 that face each other. The micro heat sink array 200 may have the shape of plates that are arranged at a certain interval in a first and a second direction D1 and D2 and extended in a first direction D1.

Figure 5:
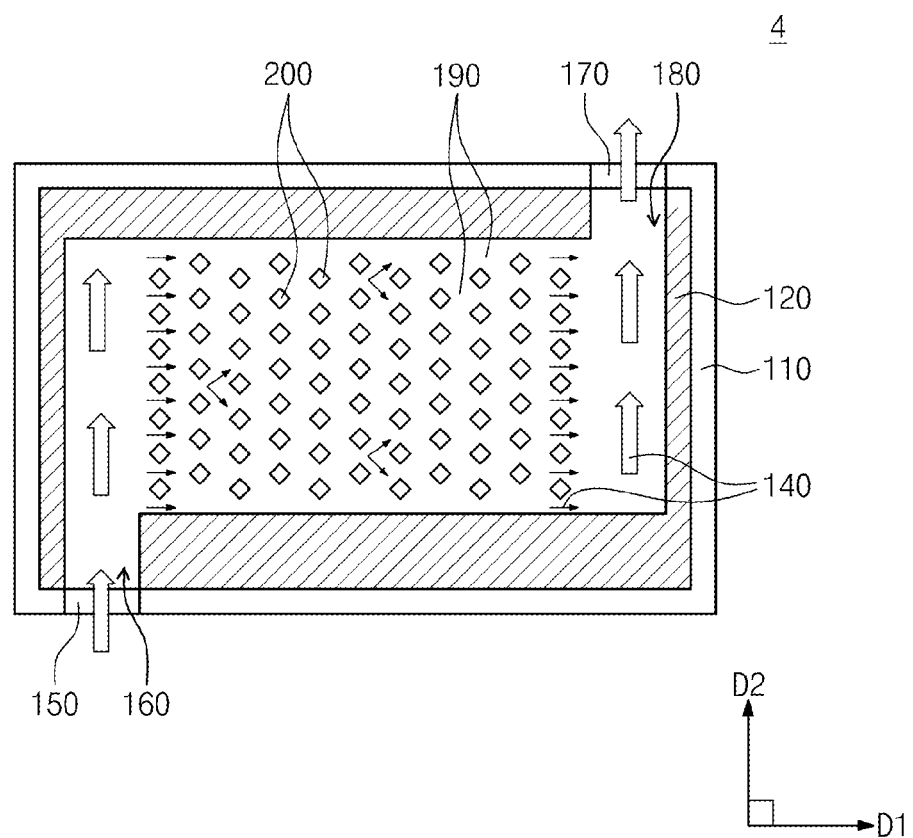
FIG. 5 is a plane view of a semiconductor device according to another embodiment of the present invention.

Referring to FIG. 5, a semiconductor device 4 according to another embodiment of the present invention may have the entry point 150 and the exit point 170 on sides of the substrate 110 that face each other. The micro heat sink array 200 may have the shape of rectangular parallelepipeds that are arranged at a certain interval in a first and a second direction D1 and D2.

Figure 6:
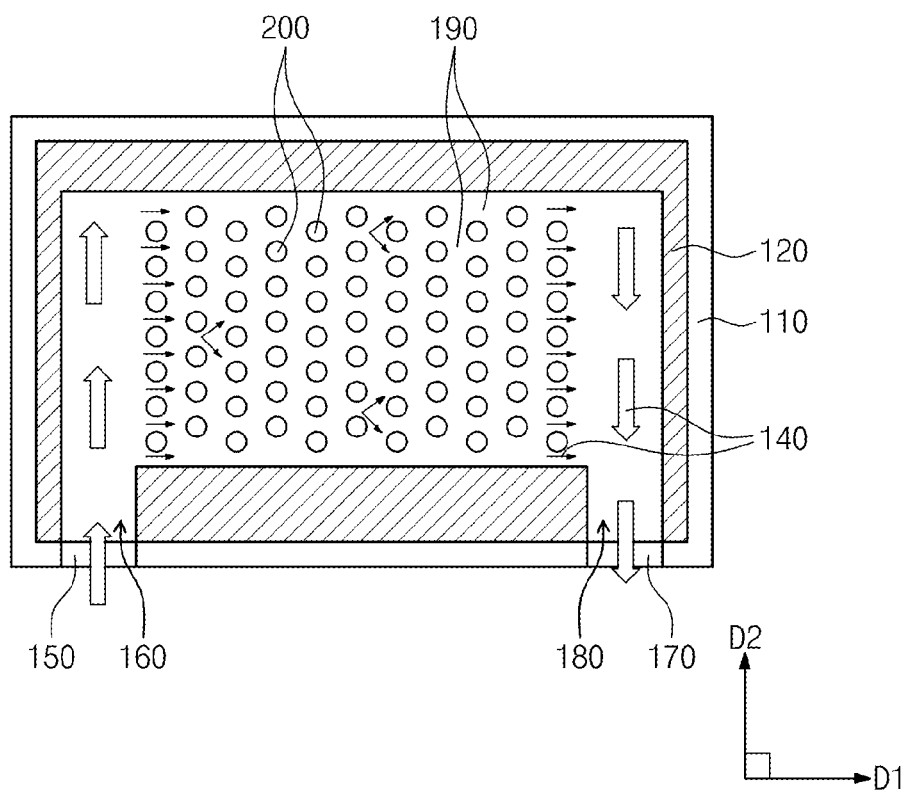
FIG. 6 is a plane view of a semiconductor device according to another embodiment of the present invention.

Referring to FIG. 6, a semiconductor device 5 according to another embodiment of the present invention may have the entry point 150 and the exit point 170 on the same side of the substrate 110. The heat sink array 200 may have the shape of cylinders that are arranged at a certain interval in a first and a second direction D1 and D2.

The directions of the entry point 150 and the exit point 170 and the micro heat sink array 200 are not limited to the above-described particular structures but applications and variations may be implemented.

FIGS. 7 to 12 are cross-sectional views of a method of fabricating a semiconductor device according to an embodiment of the present invention. In order to easily describe a process of fabricating a semiconductor device, figures are shown so that a part having a cooling structure looks upward.

Figure 7:
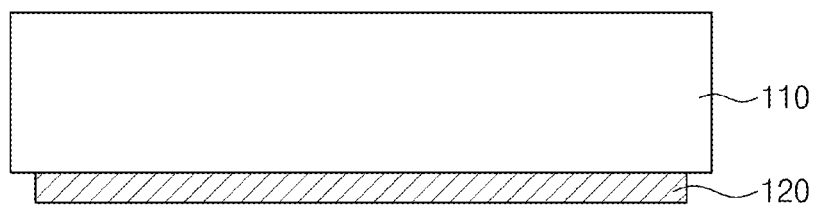
FIGS. 7 to 12 are cross-sectional views of a method of fabricating a semiconductor device according to an embodiment of the present invention.

Referring to FIG. 7, the active region 120 may be formed on the bottom of the substrate 110. The width of the active region 120 may be smaller than or the same as that of the substrate 110. The active region 120 may functions as any one of a transistor, a diode, a CPU, an ASIC, a micro sensor, a micro actuator, and an MEMS.

Figure 8:
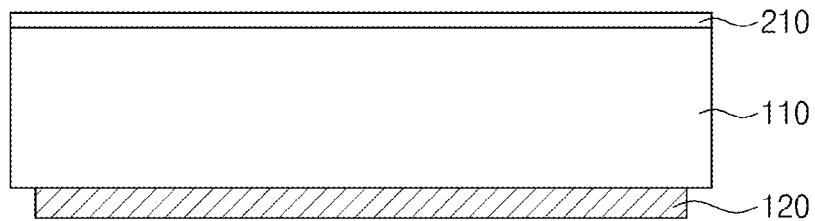

Referring to FIG. 8, the first conductive layer 210 that is an electrically conductive material may be formed on the top of the substrate 110. The first conductive layer 210 may use e-beam evaporation, sputtering or other deposition techniques. The first conductive layer 210 may be a single layer or multiple layers.

Figure 9:
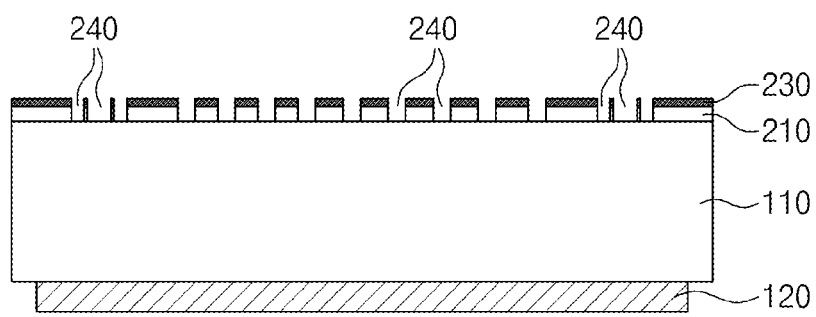

Referring to FIG. 9, a photosensitive material may be applied and patterned onto the first conductive layer 210 to form a photoresist layer 230. It is possible to form a micro line width part 240 by patterning the first conductive layer 210 by using dry etching using the photoresist layer 230 as an etching mask. If first applying the photoresist layer 230, forming an image reversal on the photoresist layer 230, depositing the first conductive layer 210 and removing the image reversal by wet etching, it is possible to form the micro line width part 240 that includes only the first conductive layer 210, although not shown.

Figure 10:
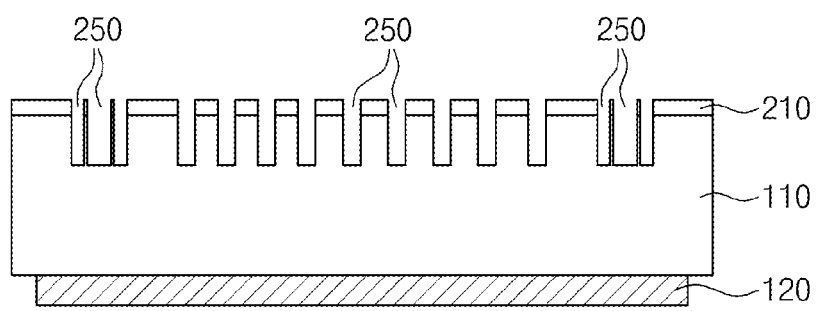

Referring to FIG. 10, after removing the photoresist layer 230, it is possible to form a plurality of trenches 250 by patterning the substrate 110 by an etching process using the first conductive layer 210 as an etching mask. The trenches 250 may be formed by using anisotropic dry etching in a direction perpendicular to the substrate 110. As the anisotropic dry etching, reactive ion etching (RIE) or deep RIE that may deeply etch the substrate 110 may be adopted. The depth of the trenches 250 may define the approximate depths of the inlet channel 160, the outlet channel 180, the micro channel array 190, and the micro heat sink array 200 that are subsequently formed. When there is a great difference in the line width of the micro line width part 240, the etching depth of the substrate 110 may be significantly different by a micro loading effect in a dry etching process.

Figure 11:
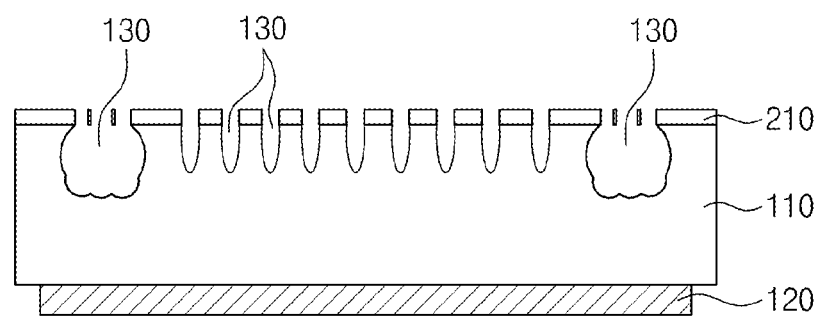

Referring to FIG. 11, by further etching the substrate 110 by an isotropic etching process using the first conductive layer 210 as an etching mask, it is possible to form a plurality of open cavities 130 for the formation of the inlet channel 160, the outlet channel 180, the micro channel array 190, and the micro heat sink array 200. The plurality of open cavities may be connected to one another. A part not etched in the isotropic etching process may function as a supporting part that supports micro structures formed in the substrate 110.

Figure 12:
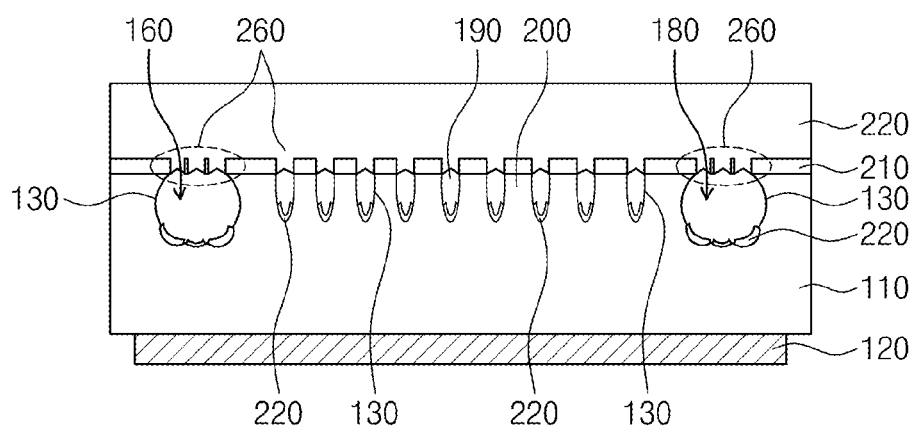

Referring to FIG. 12, the second conductive layer 220 that is an electrically conductive material may be formed on the substrate 110 including the first conductive layer 210 by using e-beam evaporation, sputtering or other deposition techniques. The plurality of open cavities may be sealed while a plurality of sealing parts 260 are formed as the second conductive layer 220 becomes thick. The second conductive layer 220 may be stacked on the plurality of open cavities thin due to the opening. The plurality of cavities sealed with the second conductive layer may form the inlet channel 160, the outlet channel 180, and the micro channel array 190. Also, the inlet channel 160, the outlet channel 180, the micro channel array 190, and the micro heat sink array 200 may be buried in the substrate 110.

As described above, according to a method of fabricating an embodiment of the present invention, it is possible to, at a time, form all elements configuring an integrated cooling structure for a semiconductor device that has any shape, size and depth by a semiconductor fabricating process using only one sheet of pattern mask. Thus, the present invention has a simpler structure than typical cooling components for a semiconductor device, may be integrally fabricated on the semiconductor device and it is possible to simplify processes and reduce manufacturing costs.

According to an example of the present invention, a cooling structure may be integrated directly onto the semiconductor device, it is possible to easily cool a device by efficiently dissipating heat generated from the active region of the semiconductor device with a small structure and the present invention may be implemented by a semiconductor process.

The detailed description of the present invention is not intended to limit the present invention to embodiments disclosed herein and may be used under other combinations, changes and environments without departing from the subject matter of the present invention. The following claims should be construed as including other embodiments.

What is claimed is:

1. A semiconductor device comprising:
an active region provided on a substrate;
an inlet channel formed as a single cavity buried in one side of the substrate;
an outlet channel formed as a single cavity buried in the other side of the substrate;
a micro channel array comprising a plurality of micro channels, wherein the plurality of micro channels are formed as a plurality of cavities buried in the substrate, and one end of the micro channel array is connected to a side of the inlet channel and the other end of the micro channel array is connected to a side of the outlet channel; and
a micro heat sink array separating the micro channels, wherein the micro heat sink array comprises the substrate and an electrically conductive layer,
wherein the substrate comprises:
a first surface being in direct contact with the active region; and
a second surface being the opposite surface of the first surface,
wherein the electrically conductive layer comprises:
a first electrically conductive layer provided on the second surface of the substrate; and
a second electrically conductive layer provided on the first electrically conductive layer, wherein the second electrically conductive layer has a plurality of sealing parts sealing the single cavity forming the inlet channel, the single cavity forming the outlet channel, and the plurality of cavities forming the micro channel array,
wherein the first electrically conductive layer includes a plurality of segments apart from each other, each segment including an upper surface facing the second surface, a lower surface opposite to the upper surface and a side surface connecting the upper surface and the lower surface, and
wherein each of the sealing parts has a side surface coming in contact with the side surface of the plurality of segments.

2. The semiconductor device of claim 1, wherein the inlet channel, the outlet channel, the micro channel array, and the micro heat sink array are arranged on the second surface of the substrate.

3. The semiconductor device of claim 1, wherein an entry point on one end of the inlet channel and an exit point on one end of the outlet channel are formed on sides of the substrate that face each other.

4. The semiconductor device of claim 1, wherein an entry point on one end of the inlet channel and an exit point on one end of the outlet channel are formed on the same side of the substrate.

5. The semiconductor device of claim 1, wherein a cooling medium flowing through the inlet channel, the micro channel array and the outlet channel comprises at least one of liquid, gas, a mixture of liquid and gas, and supercritical fluid.

6. The semiconductor device of claim 1, wherein the single cavity forming the inlet channel, the single cavity forming the outlet channel, and the plurality of cavities forming the micro channel array are connected to one another.

7. The semiconductor device of claim 2, wherein the micro heat sink array comprises a plurality of plates, wherein the plurality of plates are distributed on the second surface of the substrate, extended in a first direction and spaced apart from one another in a second direction that crosses the first direction.

8. The semiconductor device of claim 2, wherein the micro heat sink array comprises a plurality of plates, wherein the plurality of plates are distributed on the second surface of the substrate and spaced apart from one another in a first direction and in a second direction that crosses the first direction.

9. The semiconductor device of claim 2, wherein the micro heat sink array comprises a plurality of cylinders, wherein the plurality of cylinders is distributed on the second surface of the substrate.

10. The semiconductor device of claim 2, wherein the micro heat sink array comprises a plurality of rectangular parallelepipeds, wherein the plurality of rectangular parallelepipeds is distributed on the second surface of the substrate.

11. The semiconductor device of claim 1, wherein the electrically conductive layer comprises at least one of an inorganic material, an organic material, and a mixed material of the inorganic material and the organic material.

12. The semiconductor device of claim 1, wherein the first electrically conductive layer is formed in a single layer or in multiple layers, wherein the second electrically conductive layer is formed in a single layer or in multiple layers.

13. The semiconductor device of claim 1, wherein the active region includes a first surface that faces the substrate and a second surface opposite to the first surface, the second surface being exposed to an outside without being covered by an additional substrate.

14. The semiconductor device of claim 1, wherein the entire substrate operates as a ground or an electrode for the active region.

* * * * *